(12) United States Patent
Jen et al.

(10) Patent No.: US 6,376,288 B1
(45) Date of Patent: Apr. 23, 2002

(54) METHOD OF FORMING THIN FILM TRANSISTORS FOR USE IN A LIQUID CRYSTAL DISPLAY

(75) Inventors: Tean-Sen Jen, Chiai; Te-Cheng Chung, Taoyuan Hsien; Ming-Tien Lin, Taipei Hsien, all of (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/862,546

(22) Filed: May 22, 2001

(30) Foreign Application Priority Data

Feb. 27, 2001 (TW) .................................... 090104493

(51) Int. Cl.$^7$ .............................................. H01L 21/84
(52) U.S. Cl. ...................... 438/158; 438/160; 438/571; 438/486
(58) Field of Search .................................. 438/158, 160, 438/571, 486, 949, 950, 780, 166, 758, 258, 266, 660; 257/59, 72; 349/139

(56) References Cited

U.S. PATENT DOCUMENTS

| | | | | |
|---|---|---|---|---|
| 5,693,567 A | * | 12/1997 | Weisfield et al. | 437/195 |
| 5,731,216 A | * | 3/1998 | Holmberg et al. | 437/40 |
| 5,864,150 A | * | 1/1999 | Lin | 257/61 |
| 5,920,083 A | * | 7/1999 | Bae | 257/59 |
| 5,920,772 A | * | 7/1999 | Lin | 438/158 |
| 6,020,223 A | * | 2/2000 | Mei et al. | 438/158 |
| 6,075,257 A | * | 6/2000 | Song | 257/59 |
| 6,159,779 A | * | 12/2000 | Huang et al. | 438/158 |
| 6,245,602 B1 | * | 6/2001 | Ho et al. | 438/158 |

FOREIGN PATENT DOCUMENTS

JP          1235764 A   *   2/2000

* cited by examiner

Primary Examiner—Olik Chaudhuri
Assistant Examiner—Laura M Schillinger
(74) Attorney, Agent, or Firm—Darby & Darby

(57) ABSTRACT

A method of forming a TFT structure is performed on a glass substrate. A first metal layer deposited on the glass substrate is patterned with a first mask to form a gate line and a gate electrode. Next, a gate insulating layer, a first semiconductor layer and an etch-stop layer are successively formed, and backside exposure patterns the etch-stop layer. Thus, the remaining part of the etch-stop layer is disposed over the gate electrode and the gate line. Next, a second semiconductor layer and a second metal layer are successively formed, and then the second metal layer is patterned with a second mask to form a data line perpendicular to the gate line. Thereafter, the second semiconductor layer and the first semiconductor layer not covered by the second metal layer are removed. Next, a first protection layer formed on the exposed surface of the glass substrate is patterned with a third mask to form a first opening and a second opening, wherein the first opening is over the gate electrode and the second opening is over a predetermined drain electrode. Next, a conductive layer and a photoresist layer successively formed on the exposed surface of the glass substrate are patterned with a fourth mask to form a pattern of a predetermined pixel electrode. Finally, after removing the second metal layer and the second semiconductor layer underlying the first opening to expose the etch-stop layer, a second protection layer is formed on the first protection layer to fill the first opening.

14 Claims, 12 Drawing Sheets

METHOD OF FORMING THIN FILM TRANSISTORS FOR USE IN A LIQUID CRYSTAL DISPLAY

BACKGROUND OF THE INVENTION

1. Field of the Invention

The present invention relates to a method of forming thin film transistors ("TFT"s) for use in a liquid crystal display (LCD) and, more particularly, to a method with four mask steps for forming TFTs for use in an LCD.

2. Description of the Related Art

Currently, liquid crystal display (LCD), having the advantages of low power consumption, thin type, light weight and low driving-voltage, is commonly used. The applied electric field on the LCD changes the alignment of liquid crystals that possess the characteristics of dielectric anisotropy and conducting anisotropy, and the accompanied optical effects are transformed into visual variation. An LCD employing a thin film transistor (TFT) as an active device is referred to as a TFT-LCD, wherein the TFT provides low power consumption, a thin profile, light weight and low driving-voltage. However, since the TFT is thinner than traditional transistors, TFT manufacture consists of multiple photolithography steps using more than seven masks and thereby creates problems of poor yield and high costs. Seeking to improve the above-mentioned problems, various TFT structures and corresponding methods of making them have been developed to reduce the required cycles of photolithography.

FIG. 1 is a top view of a conventional TFT-LCD. FIGS. 2A to 2F are cross-sectional diagrams along line II—II showing a conventional method of forming a TFT-LCD according to the prior art. As shown in FIG. 1, the conventional TFT-LCD has a plurality of gate lines 2 extending transversely and arranged in parallel, and a plurality of data lines 4 extending lengthwise and arranged in parallel, wherein approximately rectangular areas arranged in matrix formed by adjacent gate lines 2 and data lines 4 serve as pixel areas 6. Each of the pixel areas 6 has a pixel electrode 8 covering the approximately rectangular area, and a TFT structure 10 disposed near the intersection of the gate line 2 and the data line 4. The TFT structure 10 has a gate electrode 12 lengthwise projecting from the gate line 2, a drain electrode 14 electrically connected to the pixel electrode 8, and a source electrode 6 transversely projecting from the data line 4.

In the conventional method, an etch-stop process is employed to form the TFT structure 10. As shown in FIG. 2A, using photolithography and etching with a first mask, a first metal layer deposited on a glass substrate 18 is patterned to form the gate line 2. A lengthwise projecting portion of the gate line 12 serves as the gate electrode 12 of the TFT structure 10. As shown in FIG. 2B, a gate insulating layer 20 of silicon nitride and silicon oxide, a first semiconductor layer 22 of amorphous silicon (a-Si), and an etch-stop layer 24 of silicon nitride are successively formed on the glass substrate 18. Then, using photolithography and etching from the back of the glass substrate 18 with a second mask, the etch-stop layer 24 over the gate electrode 12 remains.

Referring to FIG. 2C, a second semiconductor layer 26 of $n^+$-doped a-Si and a second metal layer are successively formed on the glass substrate 18. Next, using photolithography and etching with a third mask, the second metal layer is patterned to form the data line 4, wherein a transversely projecting portion of the data line 4 covers a part of the lengthwise projecting portion of the gate line 2. Also, the patterned second metal layer over the gate electrode 12 is separated by a first opening 30 to serve as the source electrode 16 and the drain electrode 14 respectively. Thereafter, as shown in FIG. 2D, using the patterned second metal layer as a mask, the second semiconductor layer 26 and the first semiconductor layer 22 are continuously removed until the gate insulating layer 20 is exposed. Meanwhile, using the etch-stop layer 24 as the etching end-point, the second semiconductor layer 26 at the bottom of the first opening 30 is removed. Thereby, the second semiconductor layer 26 is divided into a drain region 261 and a source region 262.

Referring to FIG. 2E, a protection layer 32 is conformally formed on the exposed surface of the glass substrate 18 and fills the first opening 30. Then, using photolithography and etching with a fourth mask, a second opening 34 is formed to expose a predetermined region of the top of the drain electrode 14. Finally, as shown in FIG. 2F, a conductive layer 36 is conformally deposited on the protection layer 32 and fills the second opening 34, and then the conductive layer 36 is patterned as the pixel electrode 8 using photolithography and etching with a fifth mask. The conductive layer 36 is of metallic materials. Alternatively, the conductive layer 36 is indium tin oxide (ITO) for increasing the aperture ratio of the TFT-LCD.

The etch-stop layer 24 is mainly used to protect the first semiconductor layer 22 from over-etching during the formation of the drain region 261 and the source region 262. However, since the second mask is needed to pattern the etch-stop layer 24, the five mask steps cannot be further reduced in the conventional method. Therefore, the problem of exposure error, increasing process complexity and prolonging exposure time, becomes worse when performing five cycles of photolithography. This causes low throughput, high production costs, and imperfections in devices. Thus, a method of forming the TFT structure with reduced mask steps solving the aforementioned problems is called for.

SUMMARY OF THE INVENTION

The present invention provides an etch-stop process to form a TFT structure with four mask steps for solving the problems caused by performing many cycles of photolithography.

The method of forming a TFT structure is performed on a glass substrate. First, a first metal layer deposited on the glass substrate is patterned with a first mask to form a gate line and a gate electrode. Next, a gate insulating layer, a first semiconductor layer and an etch-stop layer are successively formed, and then a backside exposure patterns the etch-stop layer. Thus, the remaining part of the etch-stop layer is disposed over the gate electrode and the gate line. Next, a second semiconductor layer and a second metal layer are successively formed, and then the second metal layer is patterned with a second mask to form a data line perpendicular to the gate line. Thereafter, the second semiconductor layer and the first semiconductor layer not covered by the second metal layer are removed. Next, a first protection layer formed on the exposed surface of the glass substrate is patterned with a third mask to form a first opening and a second opening, wherein the first opening is over the gate electrode and the second opening is over a predetermined drain electrode. Next, a conductive layer and a photoresist layer successively formed on the exposed surface of the glass substrate are patterned with a fourth mask to form a pattern of a predetermined pixel electrode. Finally, after removing the second metal layer and the second semiconductor layer underlying the first opening to expose the etch-stop layer, a second protection layer is formed on the first protection layer to fill the first opening.

Accordingly, it is a principal object of the invention to provide a method with reduced mask steps.

It is another object of the invention to employ backside exposure with the gate line and the gate electrode mask self-aligning the etch-stop pattern.

Yet another object of the invention is to alleviate the problem of exposure error.

It is a further object of the invention to increase throughput, decrease production costs, and improve properties of devices.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
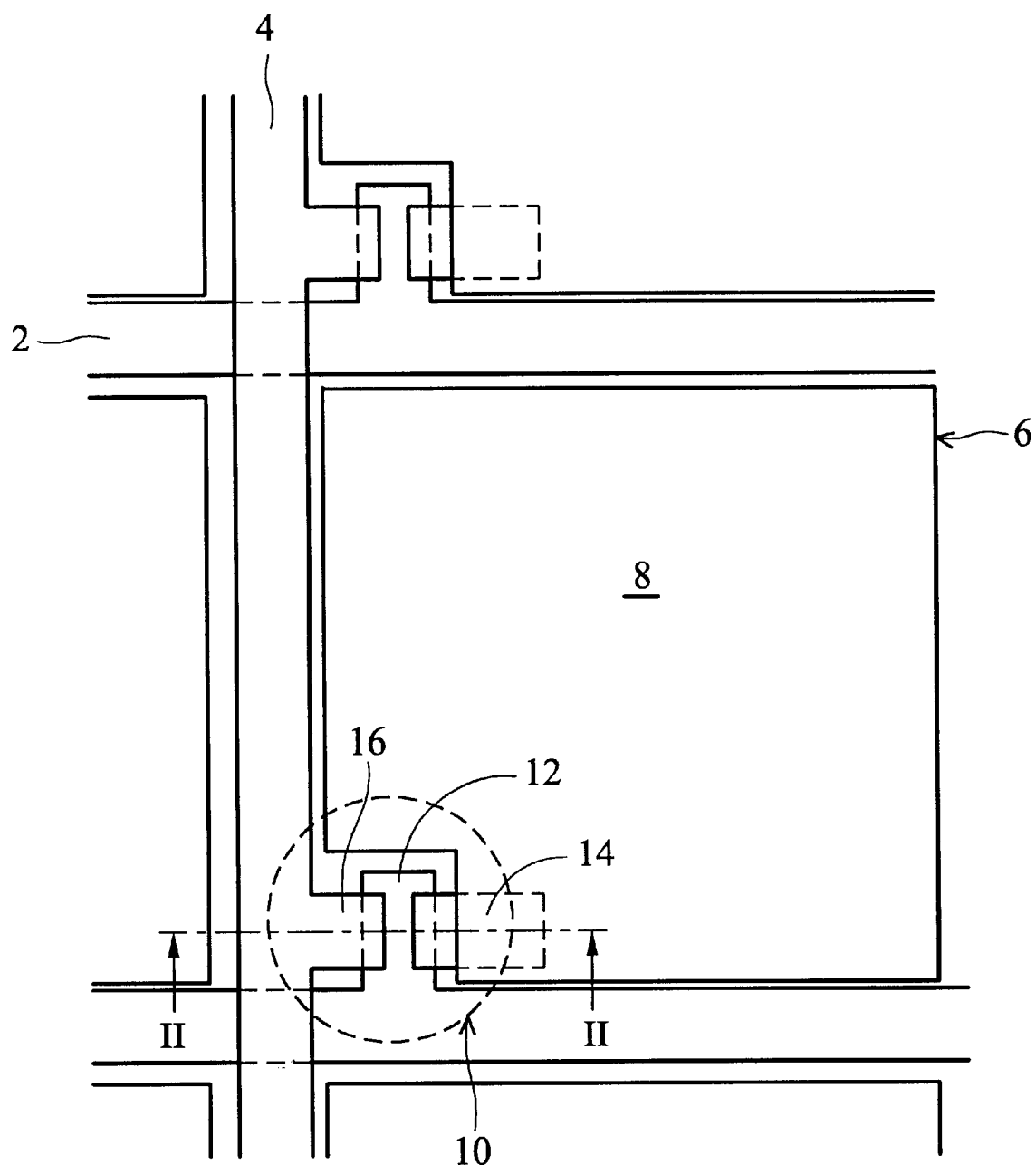
FIG. 1 is a top view of a conventional TFT-LCD.
Figure 2A:
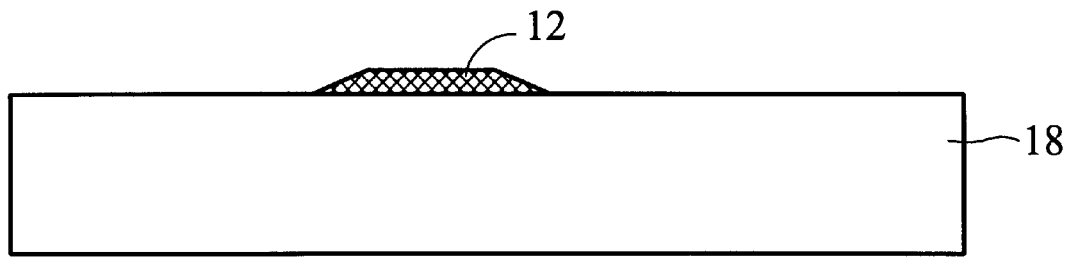
FIGS. 2A to 2F are cross-sectional diagrams along line I—I showing a conventional method of forming the conventional TFT-LCD.
Figure 2B:
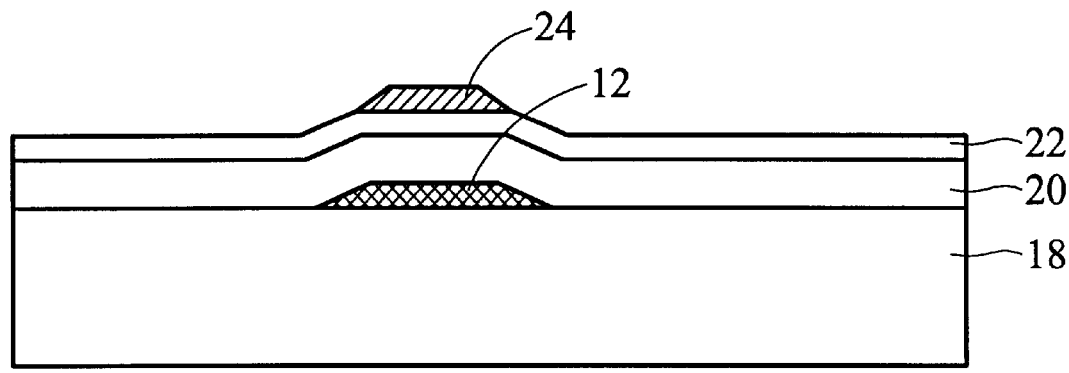
Figure 2C:
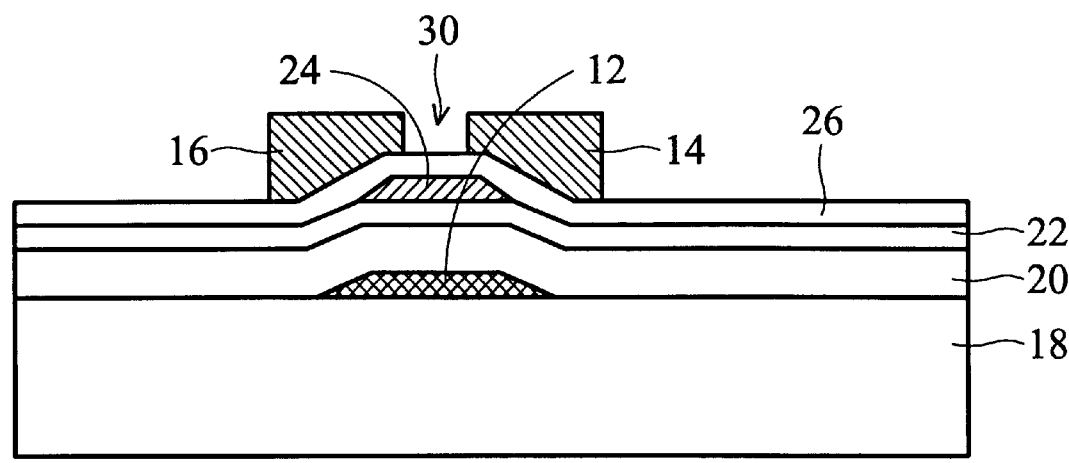
Figure 2D:
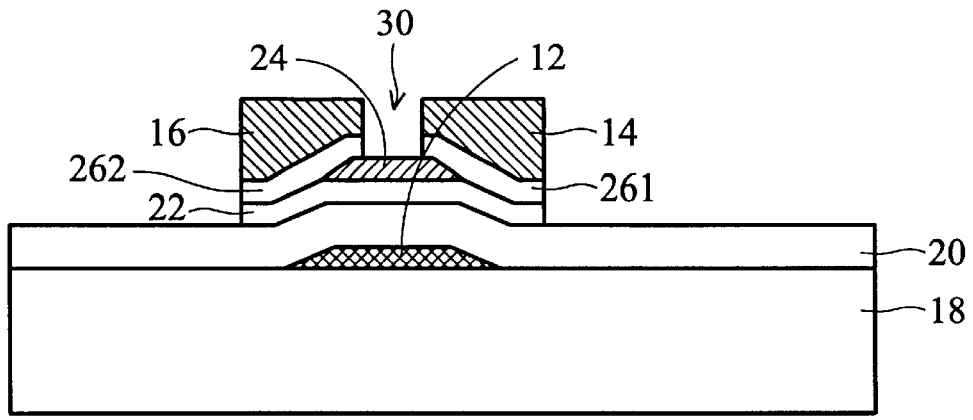
Figure 2E:
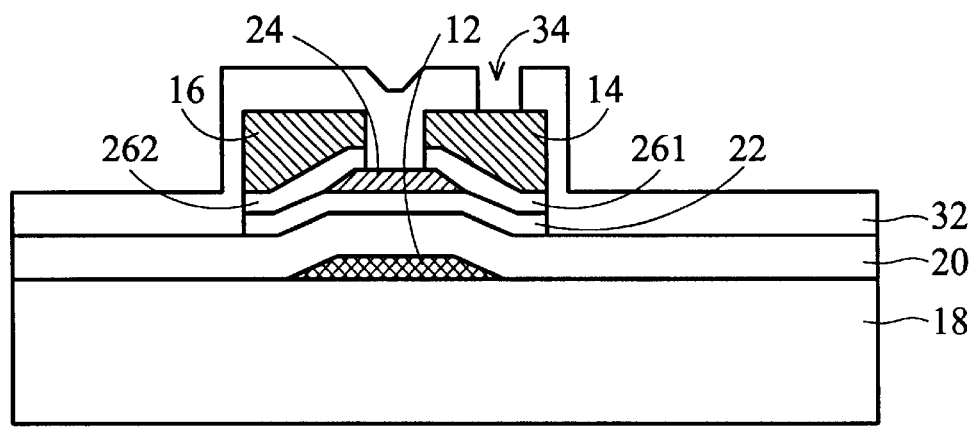
Figure 2F:
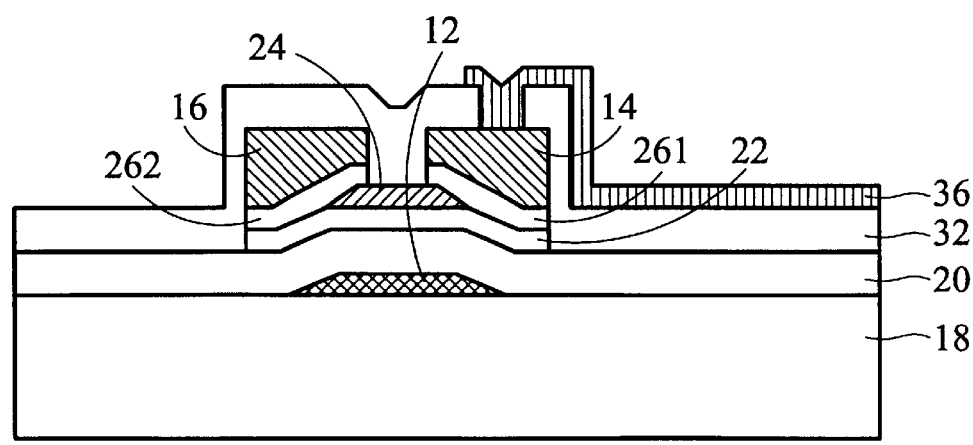
Figure 3A:
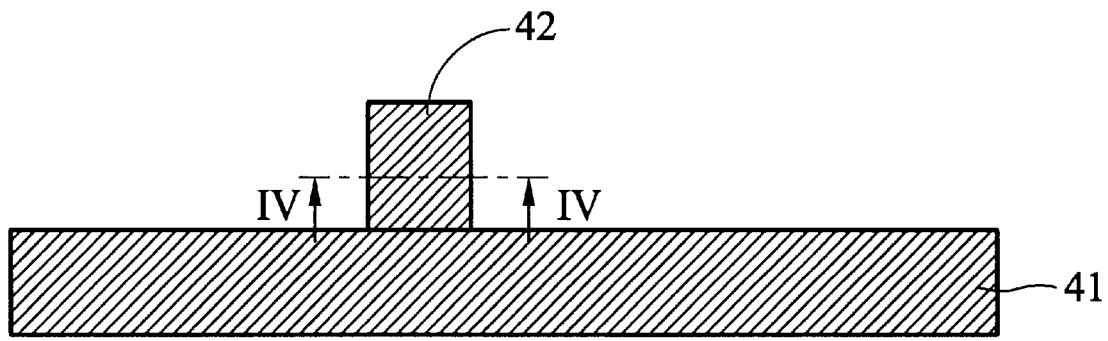
FIGS. 3A to 3F are schematic top views showing a method of forming a TFT structure according to the present invention.

FIGS. 3A to 3F are schematic top views showing a method of forming a TFT structure according to the present invention. FIGS. 4A to 4K are schematic cross-sectional diagrams along line IV—IV shown in FIG. 3. Referring to FIGS. 3A and 4A, a first metal layer of MoW or Al alloy is deposited on a glass substrate 40, and then the first metal layer is patterned to form a gate line 41 and a gate electrode 42 using photolithography and etching with a first mask. The gate line 41 extends transversely, and the gate electrode 42 is an approximately rectangular portion that lengthwise projects from the gate line 41.

Figure 3B:
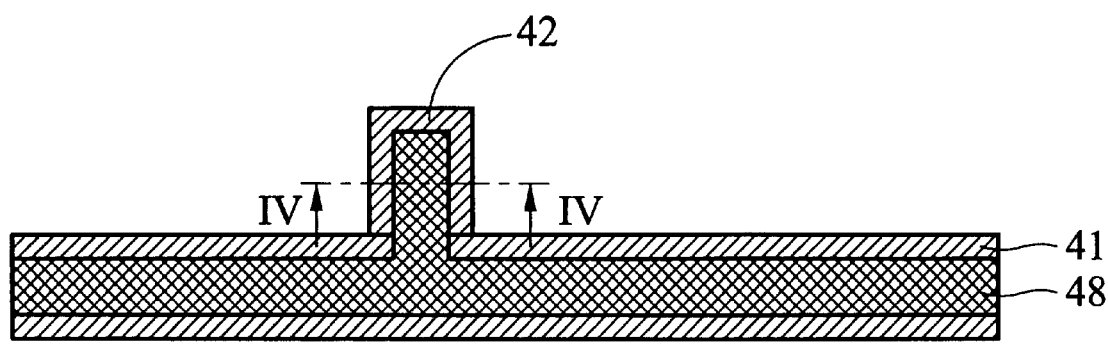
Figure 3C:
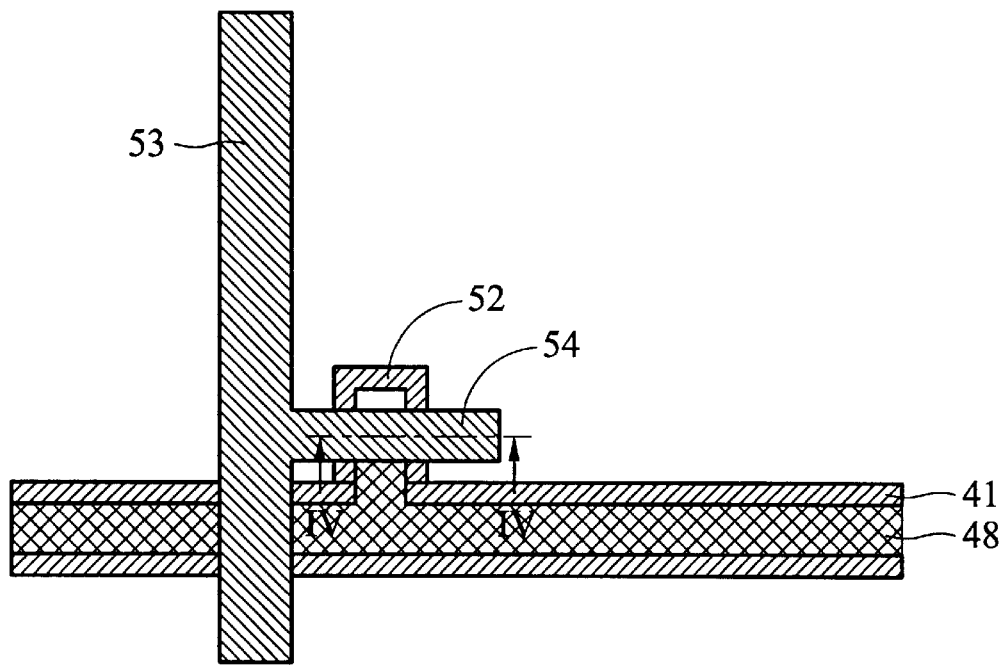
Figure 4A:
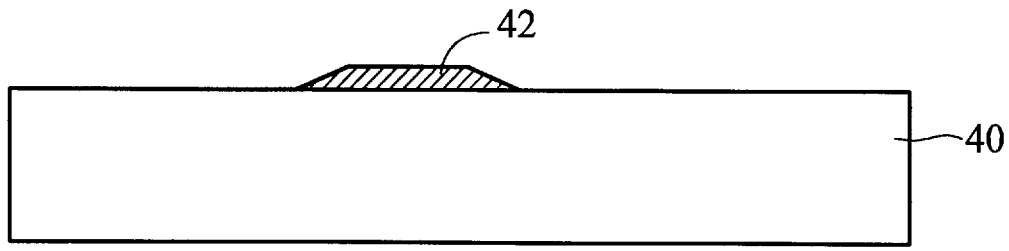
FIGS. 4A to 4K are schematic cross-sectional diagrams along line IV—IV shown in FIG. 3.
Figure 4B:
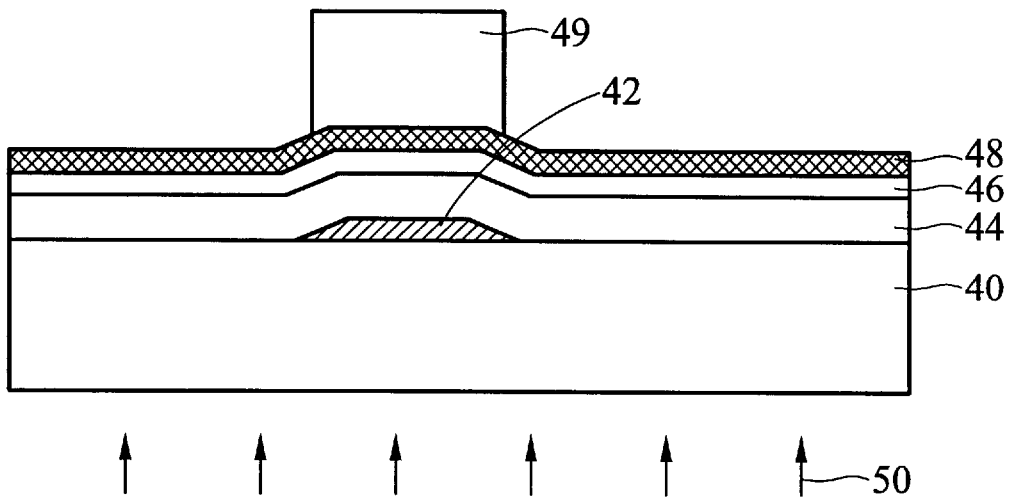
Figure 4C:
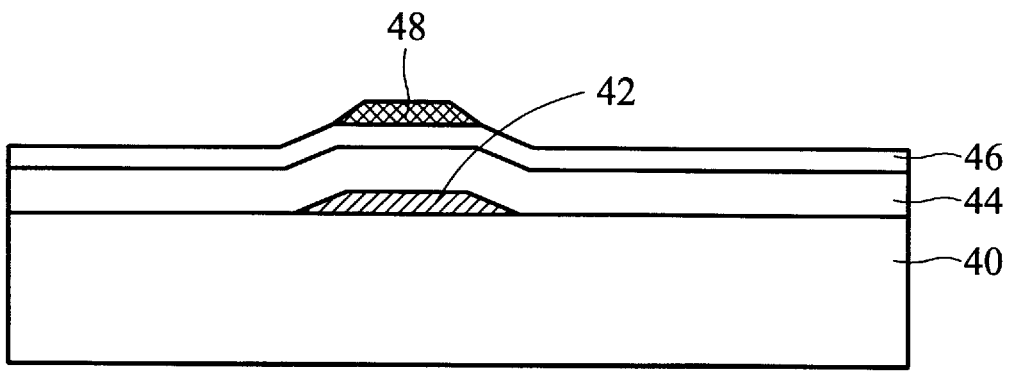

Refer to FIGS. 3B and 4B to 4D. A gate insulating layer 44, a first semiconductor layer 46 and an etch-stop layer 48 are successively formed on the glass substrate 40. Preferably, the gate insulating layer 44 is formed by laminating a silicon oxide layer and a silicon nitride layer, the first semiconductor layer 46 is amorphous silicon (a-Si), and the etch-stop layer 48 is silicon nitride. Then, a first photoresist layer 49 is formed on the etch-stop layer 48. Next, using backside exposure 50 with the gate line 41 and the gate electrode 42 as the mask, the unexposed portion of the photoresist layer 49 is removed in the subsequent development, as shown in FIG. 4B. Thereafter, using the patterned photoresist layer 49 as the mask, part of the etch-stop layer 48 is etched away. Therefore, as shown in FIGS. 3B and 4C, the remaining part of the etch-stop layer 48 is disposed over the gate line 41 and the gate electrode 42.

Figure 4D:
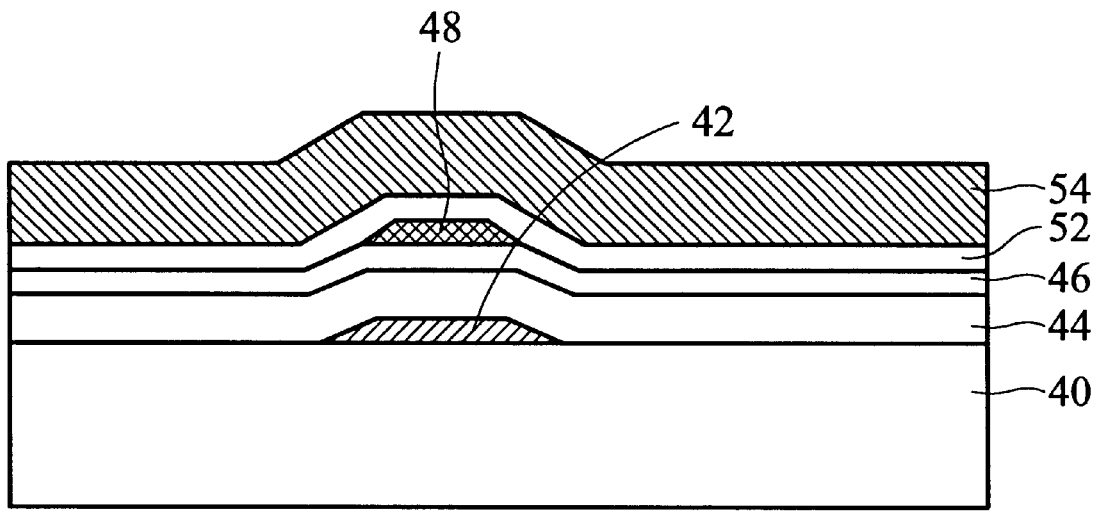
Figure 4E:
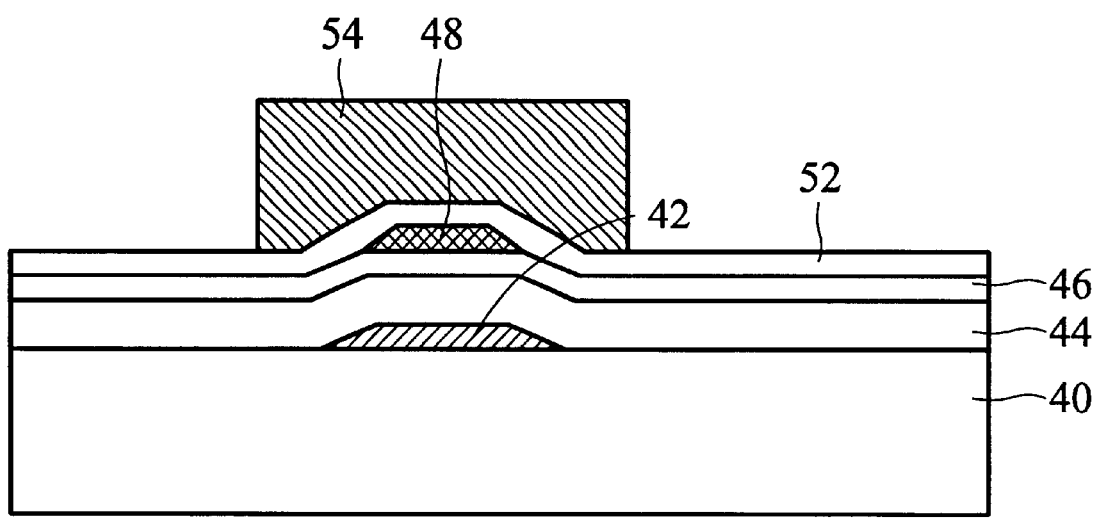
Figure 4F:
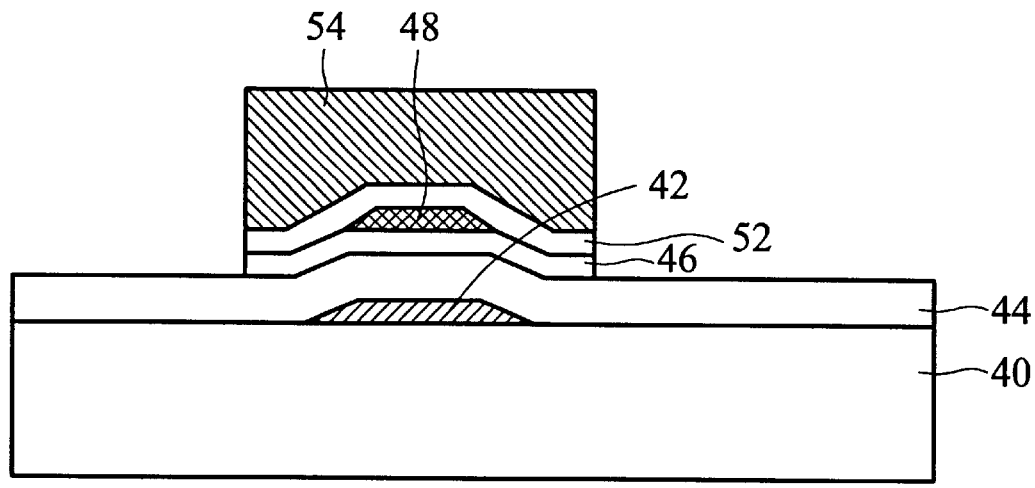

Refer to FIGS. 3C, and 4D to 4F. As shown in FIG. 4D, a second semiconductor layer 52 of $n^+$-doped amorphous silicon ($n^+$ a-Si) and a second metal layer 54 are successively formed on the glass substrate 40. Then, as shown in FIG. 4E, using photolithography and etching es with a second mask, the second metal layer 54 is patterned to form a data line 53 that is perpendicular to the gate line 41 and has a transversely projecting portion covering part of the gate electrode 42. Next, as shown in FIG. 4F, using the patterned second metal layer 54 as the mask, the exposed region of the second semiconductor layer 52 and the first semiconductor layer 46 are successively etched away, thus exposes the gate insulating layer 44.

Figure 3D:
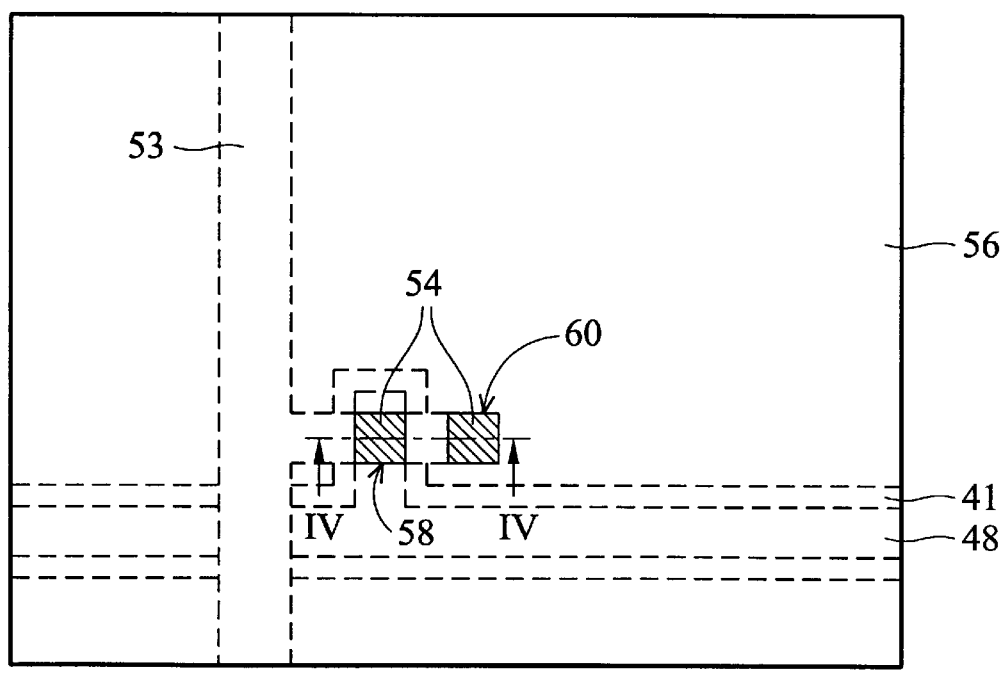
Figure 4G:
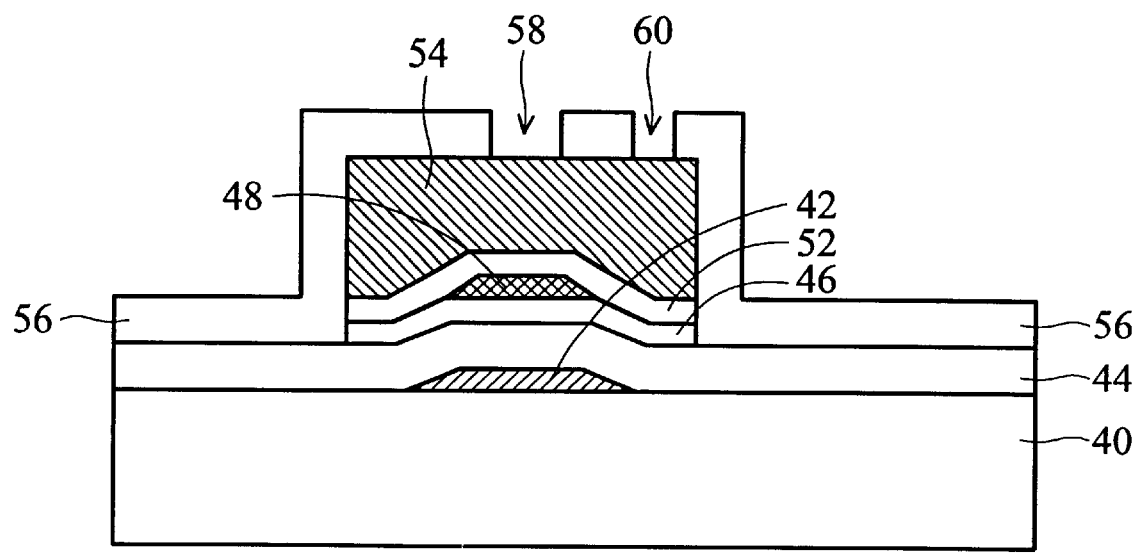

Referring to FIGS. 3D and 4G, a first protection layer 56 of silicon oxide, silicon nitride or other insulating material is conformally formed on the exposed surface of the glass substrate 40. Then, using photolithography and etching with a third mask, predetermined regions of the protection layer 56 are removed to expose the second metal layer 54. Thus, a first opening 58 is formed over the gate electrode 42, and a second opening 60 is formed over a predetermined drain electrode formed in the subsequent processes.

Figure 3E:
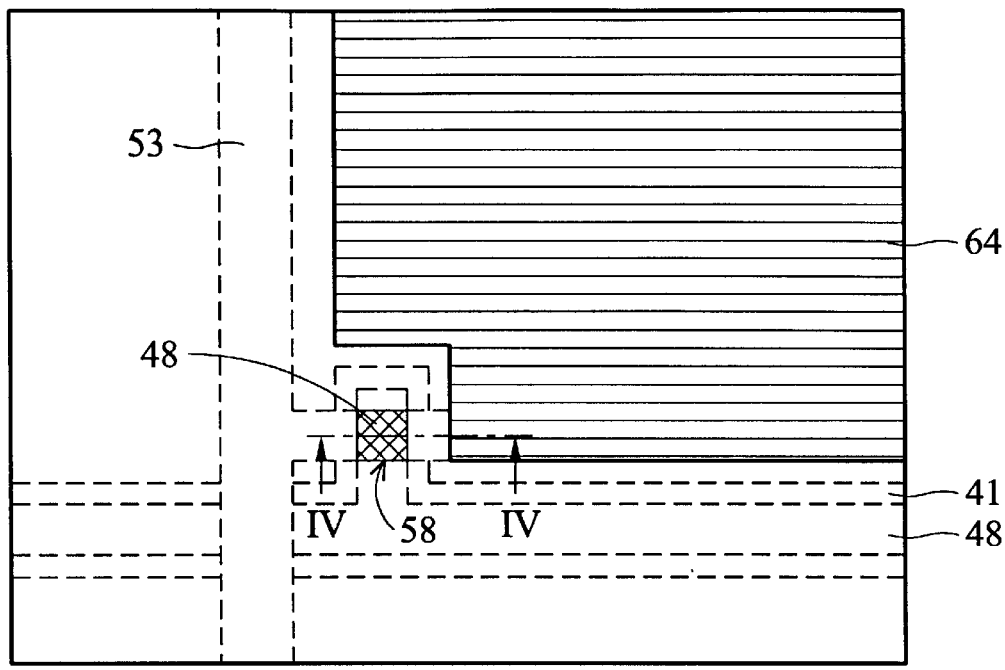
Figure 4H:
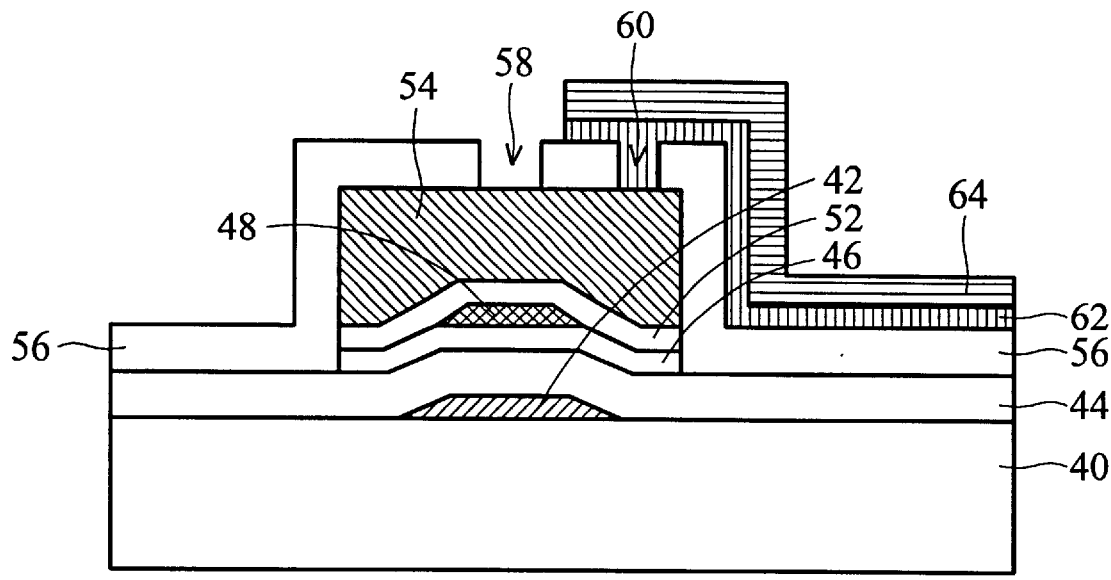
Figure 4I:
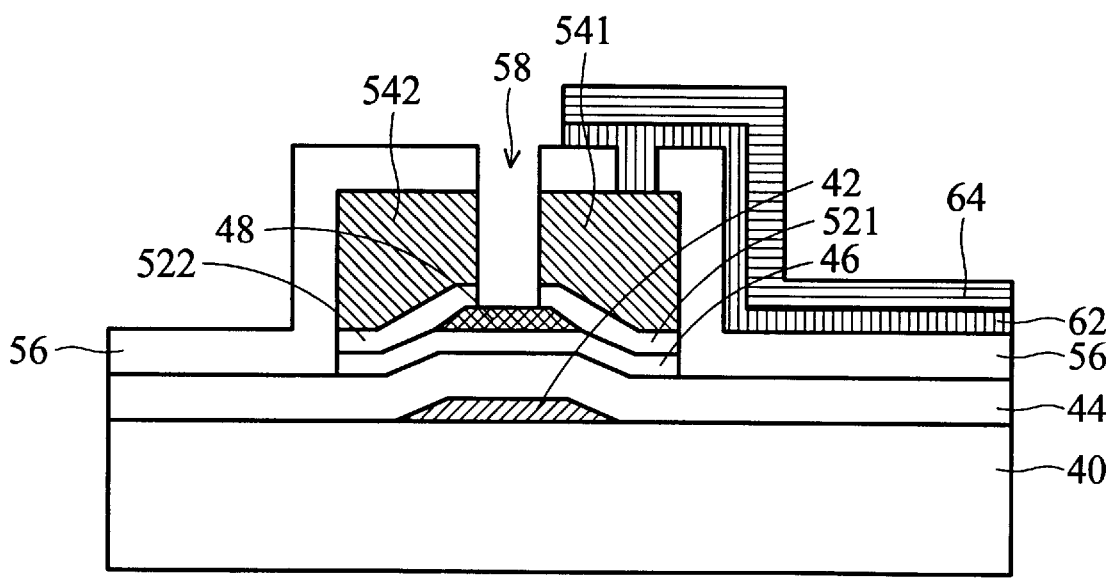

Refer to FIGS. 3E, 4H and 4I. As shown in FIG. 4H, a conductive layer 62 and a second photoresist layer 64 are successively formed on the exposed surface of the glass substrate 40. The conductive layer 62 may be of metallic materials. Alternatively, the conductive layer 62 may be indium tin oxide (ITO) for increasing the aperture ratio of the TFT-LCD. Then, using photolithography and etching with a fourth mask, part of the second photoresist layer 64 are removed to form a predetermined pattern of a pixel electrode. Next, using the patterned second photoresist layer 64 as the mask, part of the conductive layer 62 is removed to expose the first opening 58 and part of the protection layer 56. Thereby, the remaining part of the conductive layer 62 filling the second opening 62 serves as a pixel electrode 62. Thereafter, as shown in FIG. 4I, using selective etching, the second metal layer 54 and the second semiconductor layer 52 underlying the first opening 58 are removed until the etch-stop layer 48 is exposed. Thus, the second metal layer 54 over the gate electrode 42 is divided into two parts, which serve as a drain electrode 541 and a source electrode 542. Meanwhile, the second semiconductor layer 52 over the gate electrode 42 is divided into two parts, which serve as a drain region 521 and a source region 522. The drain electrode 541 can electrically connect to the pixel electrode 62 through the second opening 60.

Figure 3F:
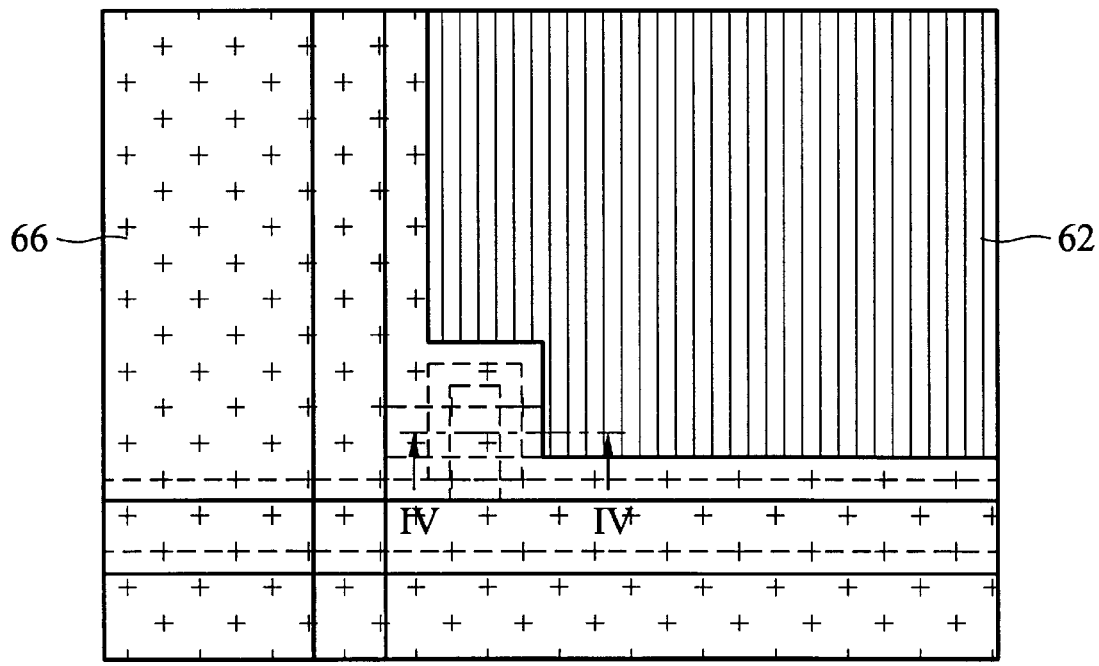
Figure 4J:
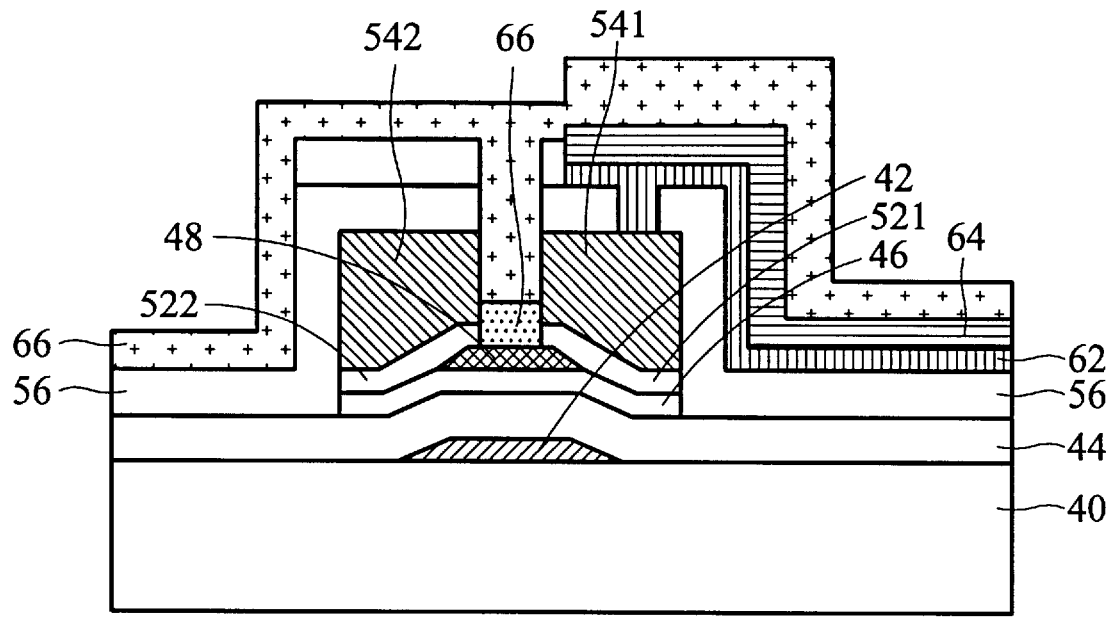
Figure 4J:
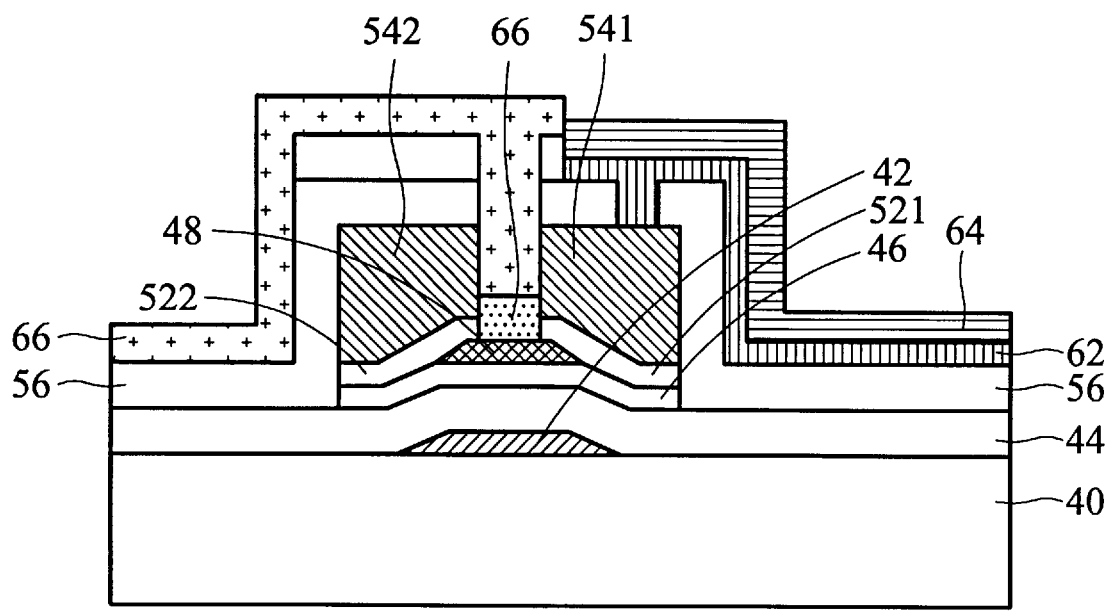
Figure 4K:
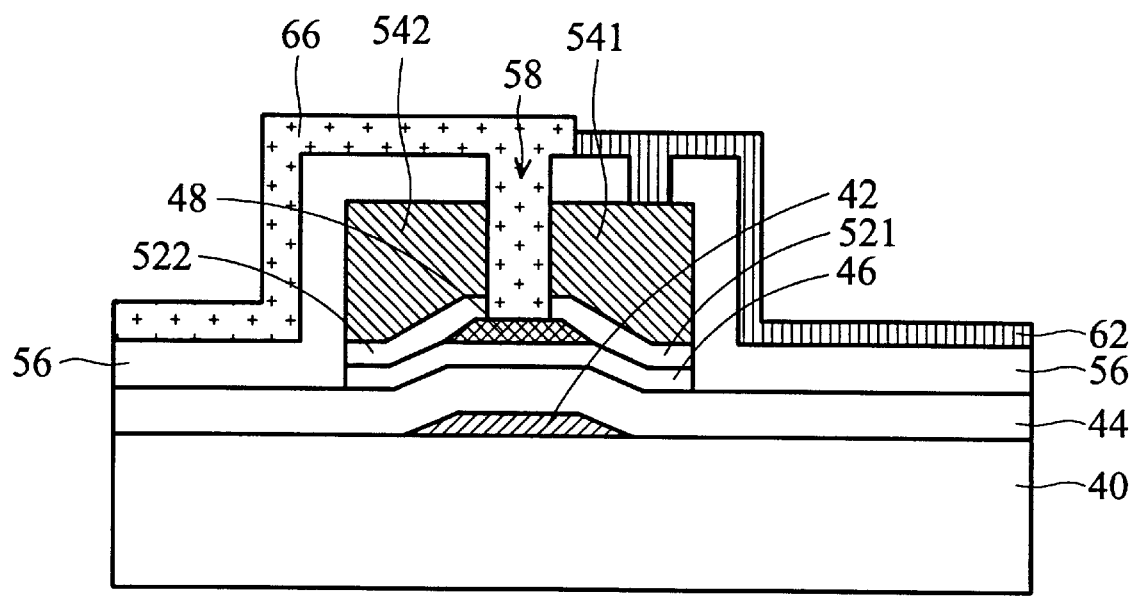

Referring to FIG. 3F, a second protection layer 66 of silicon oxide, silicon nitride or other insulating material is formed on the exposed surface of the first protection layer 56 and fills the first opening 58, wherein the pixel electrode 62 is exposed. In the present invention, two methods of forming the second protection layer 66 are provided. In the first method, as shown in FIG. 4J, the second protection layer 66 is deposited on the exposed surface of the glass substrate 40 by sputtering, and then the second protection layer 66 covering the second photoresist layer 64 and the second photoresist layer 64 are stripped off by a lift-off technique. Consequently, as shown in FIG. 4K, the second protection layer 66 covers most regions except the pixel electrode 62. In the second method, as shown in FIG. 4J', using low pressure liquid deposition, the second protection layer 66 is selectively deposited on the exposed surface of the first protection layer 56 and fills the first opening 58. Then, the second photoresist layer 64 is removed to expose the pixel electrode 62. This result is the same shown in FIG. 4K.

Compared with the conventional method, the present invention employs backside exposure with the gate line 41 and the gate electrode 42 to self-align the pattern of the etch-stop layer 48, thus eliminating one mask step. Unlike the present method of forming the TFT structure with four mask steps, the problem of exposure error is alleviated. Also, this can increase throughput, decrease production costs, and improve device properties.

It is to be understood that the present invention is not limited to the embodiments described above, but encompasses any and all embodiments within the scope of the following claims.

What is claimed is:

1. A method of forming a thin film transistor (TFT), comprising steps of:
   (a) providing a glass substrate;
   (b) forming a first metal layer on the glass substrate, and then patterning the first metal with a first mask to form a gate line and a gate electrode;
   (c) forming a gate insulating layer, a first semiconductor layer and an etch-stop layer successively on the exposed surface of the glass substrate, and then patterning the etch-stop layer by backside exposure, wherein the remaining part of the etch-stop layer is disposed over the gate electrode;
   (d) forming a second semiconductor layer and a second metal layer successively on the exposed surface of the glass substrate, and then patterning the second metal layer with a second mask to form a data line perpendicular to the gate line;
   (e) removing the second semiconductor layer and the first semiconductor layer not covered by the second metal layer;
   (f) forming a first protection layer on the exposed surface of the glass substrate, and then forming a first opening and a second opening passing through the first protection layer with a third mask, wherein the first opening is over the gate electrode and the second opening is over a predetermined drain electrode;
   (g) forming a conductive layer and a photoresist layer successively on the exposed surface of the glass substrate, and then patterning the photoresist layer and the conductive with a fourth mask to form a pattern of a predetermined pixel electrode;
   (h) removing the second metal layer and the second semiconductor layer underlying the first opening to expose the etch-stop layer; and
   (i) forming a second protection layer on the first protection layer to fill the first opening.

2. The method according to claim 1, wherein the gate electrode projects vertically from the gate line.

3. The method according to claim 1, wherein the first semiconductor layer is amorphous silicon (a-Si).

4. The method according to claim 1, wherein the etch-stop layer is silicon nitride.

5. The method according to claim 1, wherein backside exposure uses the gate line and the gate electrode as the mask, and thereby the remaining part of the etch-stop layer is disposed over the gate line and the gate electrode.

6. The method according to claim 1, wherein the second semiconductor layer is doped amorphous silicon.

7. The method according to claim 1, wherein during patterning the second metal layer with the second mask, a portion is vertically projected from the data line and disposed over part of the gate electrode.

8. The method according to claim 1, wherein the first protection layer is silicon nitride.

9. The method according to claim 1, wherein the conductive layer is indium tin oxide (ITO).

10. The method according to claim 1, wherein the first opening divides the second metal layer into a drain electrode and a source electrode.

11. The method according to claim 10, wherein the second conductive layer filling the second opening serves as a pixel electrode and electrically connected to the drain electrode.

12. The method according to claim 1, wherein the first opening divides the second semiconductor layer into a drain region and a source region.

13. The method according to claim 1, wherein the step (i) comprises:
   (i1) performing a sputter to form the second protection layer; and
   (i2) performing a lift-off to remove the photoresist layer and the second protection layer covered by the photoresist layer.

14. The method according to claim 1, wherein the step (i) comprises:
   (i1) performing a low pressure liquid deposition to selectively form the second protection layer on the exposed surface of the first protection layer; and
   (i2) removing the photoresist layer.

* * * * *